United States Patent
Daley

(10) Patent No.: US 6,798,112 B1
(45) Date of Patent: Sep. 28, 2004

(54) ARMATURE GROUND LOCATING TEST PROCESS AND EQUIPMENT

(75) Inventor: Paul B. Daley, London (CA)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 10/423,815

(22) Filed: Apr. 25, 2003

(51) Int. Cl.[7] .......................... H02K 1/22; G01N 27/72
(52) U.S. Cl. ..................... 310/261; 310/179; 324/545; 324/546; 324/228; 324/772
(58) Field of Search .............................. 310/261–262, 310/179–180, 225; 324/228, 545–546, 691, 772

(56) References Cited

U.S. PATENT DOCUMENTS

| | | | | |
|---|---|---|---|---|
| 3,719,883 A | * | 3/1973 | Pentecost | 324/538 |
| 4,456,874 A | * | 6/1984 | Anderson | 324/545 |
| 4,491,790 A | * | 1/1985 | Miller | 324/142 |
| 5,134,378 A | * | 7/1992 | Twerdochlib | 324/545 |
| 5,546,008 A | * | 8/1996 | Sminchak et al. | 324/690 |
| 2004/0090228 A1 | * | 5/2004 | Goodrich et al. | 324/228 |

* cited by examiner

Primary Examiner—Thanh Lam
(74) Attorney, Agent, or Firm—Cary W. Brooks

(57) ABSTRACT

A process and an apparatus for locating ground faults in motor armatures includes shorting a commutator of a motor armature with a shorting strap and connecting a variable voltage AC power supply and a load in series between the commutator and a core of the motor armature. The magnitude of a voltage applied by the AC power supply to the commutator is increased until current flows through a winding grounded point on the motor armature. Then a probe of a gauss meter is moved along an edge of the core adjacent the commutator to locate a core slot having a highest magnetic field reading measured by the gauss meter. The probe is moved along the core slot with the highest reading until the gauss meter measures a sudden reduction in the magnetic field indicating the grounded point.

13 Claims, 2 Drawing Sheets

ARMATURE GROUND LOCATING TEST PROCESS AND EQUIPMENT

BACKGROUND OF THE INVENTION

The present invention relates generally to traction motors and, in particular, to a process and equipment for locating traction motor armature ground faults.

Typically, it is difficult to locate armature ground faults in large traction motors such as the type used to power electric locomotives. One known method of testing for ground faults involves connecting a 120 volt line source through a resistive light bank to pass current through the armature windings in an attempt to generate smoke at the ground fault location. This method does not always produce observable smoke and, when it works, it only provides an approximate location for the ground fault. When this method does not work, a higher current capacity power source must be used which is destructive to the armature core and also destroyed any evidence of the root cause of the armature defect. Neither the line source/light bank method nor the high current source method is effective in identifying armatures with lower coil ground faults.

SUMMARY OF THE INVENTION

A process and an apparatus for locating ground faults in motor armatures according to the present invention includes shorting a commutator of a motor armature with a shorting strap and connecting a variable voltage AC power supply and a load in series between the commutator and a core of the motor armature. The magnitude of a voltage applied by the AC power supply to the commutator is increased until current flows through a winding grounded point on the motor armature. Then a probe of a gauss meter is moved along an edge of the core adjacent the commutator to locate a core slot having a highest magnetic field reading measured by the gauss meter. The probe is moved along the core slot with the highest reading until the gauss meter measures a sudden reduction in the magnetic field indicating the grounded point.

The armature ground fault detection process and equipment according to the present invention utilize an adjustable voltage power supply with a built in current limiting capacity such that only the amount of current required to thoroughly test the armature coils is applied. A magnetic field detecting gauss meter measures the paths of the test current throughout the armature. The meter operator can interpret the measurement results to pinpoint the location of the ground fault thereby enabling repair and analysis of the root cause.

Some of the advantages of using the process and equipment according to the present invention include: eliminating the scrapping or teardown of armatures during production; enabling root cause analysis of armature failures for corrective action to fix failed armatures and to prevent failures in future production; labor savings in reduced testing time; and easy adaptability to AC stators for all types of motors.

BRIEF DESCRIPTION OF THE DRAWINGS

The above, as well as other advantages of the present invention, will become readily apparent to those skilled in the art from the following detailed description of a preferred embodiment when considered in the light of the accompanying drawings in which.

DESCRIPTION OF THE PREFERRED EMBODIMENT

Figure 1:
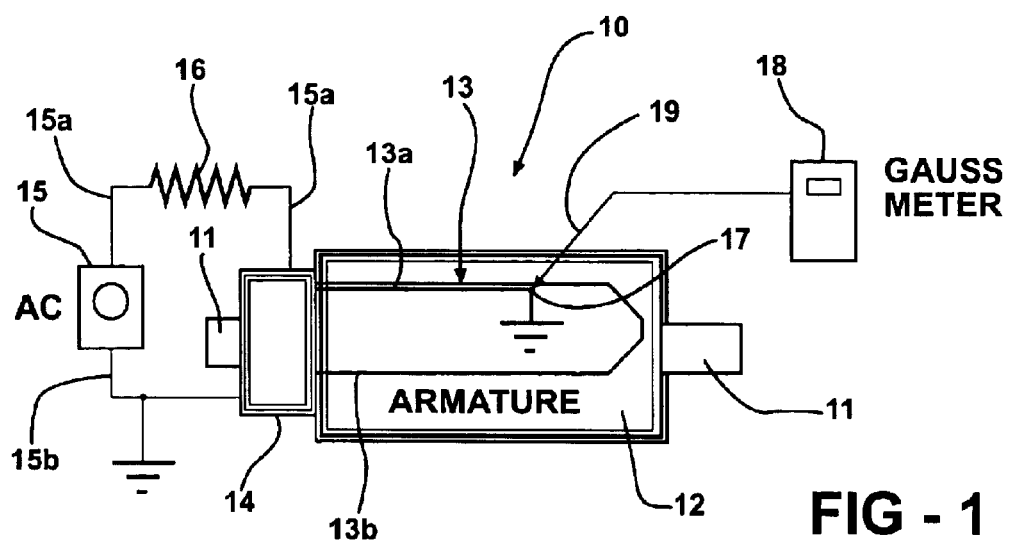
FIG. 1 is a schematic diagram of a traction motor armature and ground locating test equipment in accordance with the present invention.

There is shown in FIG. 1 a conventional traction motor armature assembly 10 including a shaft 11 on which is mounted an armature core 12 having at least one winding 13. The core 12 is formed of a plurality of metal laminations (not shown) each extending in an associated plane transverse to a longitudinal axis of the shaft 11. Each of a plurality of slots (not shown) extends radially inwardly from a periphery of the core 12 and parallel to the longitudinal axis of the shaft 11. The conductors of the windings extend through the slots reversing direction at least once at an end of the core 12, as illustrated by the winding 13, depending upon the number of turns. Opposite ends of the windings are connected to a commutator 14 mounted on the shaft 11.

In an armature that has a winding with a ground fault, if an AC or DC supply voltage of sufficient magnitude is applied to all of the conductors in the armature, the conductor with the ground fault will conduct electricity to the core ground. In accordance with the process and equipment according to the present invention, a meter equipped with a magnetic sensing probe can be used to detect the magnetic filed around the conductor that has grounded. There may be several current paths in the armature—usually four for locomotive traction motor armatures. However, the maximum current will flow through the winding with the ground fault. The location of the ground is at the maximum change in the magnetic flux reading as indicated on a gauss meter.

As shown in FIG. 1, a variable voltage AC power supply 15 with current limiting capability has one test lead 15a connected through a resistive load 16 to the commutator 14 to generate a flow of current through the winding 13. Another test lead 15b of the power supply 15 is grounded to the core 12 through the body of the commutator 14. The winding 13 is shown as having a ground fault 17 along a portion of the conductor extending through one of the slots (not shown) in the armature core 12. A gauss meter 18 having a probe 19 is utilized to detect the location of the ground fault 17. The method of detection involves locating, measuring and comparing the magnitude of the magnetic field values generated by the current flowing in the winding 13 and all other windings of the armature 10.

For example, for a current of seven amps flowing in the winding 13, a corresponding magnetic field of three to four gauss is generated when measured in close proximity to the supply test lead 15a connected to the commutator 14. The strength of the field diminishes as the probe 19 is moved away from the test lead 15a or the winding 13.

In FIG. 1, the winding 13 has a first conductor portion 13a connected between the commutator 14 and the ground fault 17. The strength of the field beside the armature winding first portion 13a that is carrying the current is in the order of 2.5 gauss when measured in the core slot. When you move to the other side of the winding 13, at a second conductor portion 13b, the field is in the order of 0.8 gauss. The strength of the measured field outside the core slot of the grounded winding is significantly less.

The reason that the strength of the field diminishes in the current carrying winding versus the test lead is that the current is dispersed over a larger area in the winding versus the more concentrated, smaller test lead and secondly that a few parallel paths are established resulting in the current flowing through more than one winding in the armature such that the magnetic field is being measured in more than one armature winding.

The reason that the strength of the measured field increases in the slot is the positive effect of the steel core, which enhances the generated magnetic field.

Figure 2:
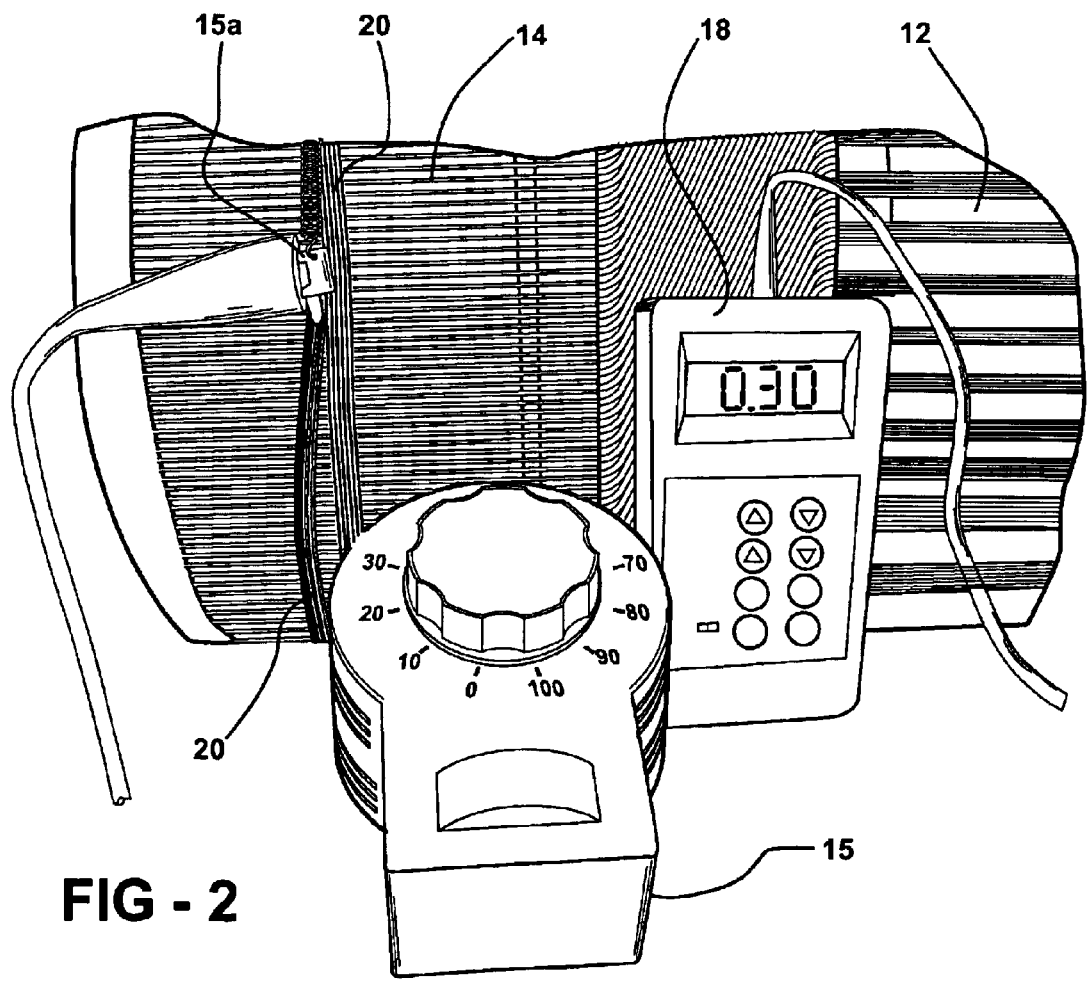
FIG. 2 is a fragmentary perspective view of the commutator end of the armature and test equipment of FIG. 1.
Figure 3:
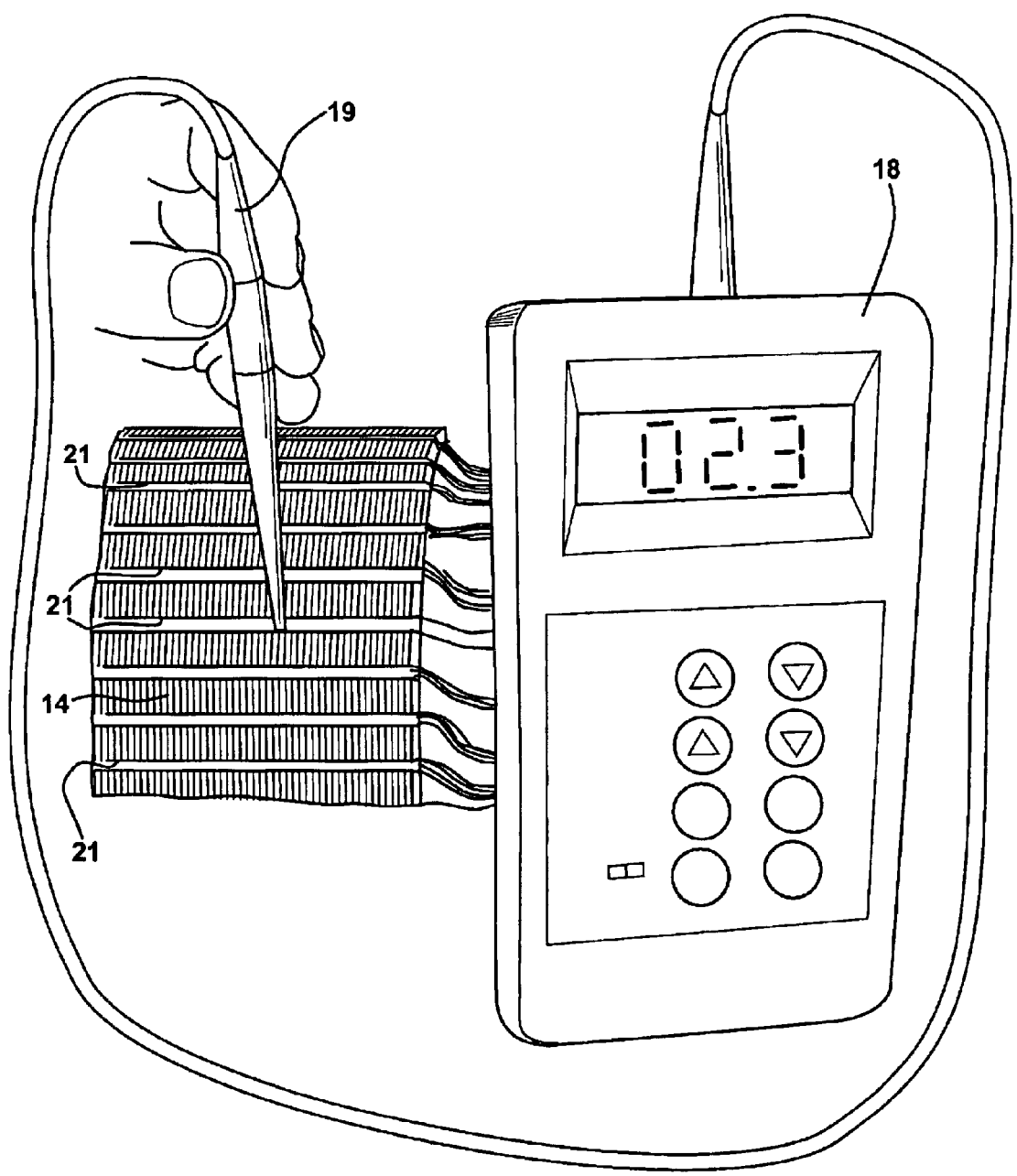
FIG. 3 is an enlarged view of the commutator of FIG. 2 with the gauss meter and probe of FIG. 1.

The process according to the present invention begins with shorting out the entire commutator 14 of the armature using a shorting strap 20 as shown in FIG. 2, which is typically formed of a copper material. Next, an AC Hi-Pot tester, not shown, is utilized to bump the ground two or three times or until the Hi-Pot meter barely moves indicating a good carbon track from the shorted conductor to the core 12.

A 1500-Watt load 16 (FIG. 1) is connected in series with the AC power supply 15. A 120-Volt ten amp Variac has been successfully utilized as a suitable power source. The grounded lead 15b (FIG. 1) is connected to the armature core 12 and the lead 15a going back the 1500-Watt load is connected to the commutator 14, which has been shorted with the copper strap 20.

Gradually, the magnitude of the applied voltage is increased until a flow of current is established through the grounded point 17 on the armature 10. If the maximum voltage is attained without any current flow, the hi-Pot procedure should be repeated. Repeated testing indicates that a voltage of 80–100 volts AC is required to initiate the current flow with a steady state voltage of typically 60–70 volts required for sustaining the current flow. The desired current flow for EMD (General Motors Corporation Electro-Motive Division) D90 and D43 armatures is typically seven amps for a gauss meter with a resolution of 0.1 gauss.

The transverse probe 19 of the gauss meter 18 is positioned in the same direction as the planes of the core laminations and at a right angle to the windings in the core 12 (transverse to the longitudinal axis of the shaft 11). The gauss meter probe 19 is moved along the edge of the core 12 next to the commutator 14 one slot 21 at a time.

In reference to the measured values, for a current of seven amps the winding with the ground fault will measure 2–4 gauss. The windings seventeen slots to either side of the grounded winding will exhibit readings of 1.2 and 0.6 gauss.

Every armature coil slot 21 around the entire armature 10 is measured according to the process of the present invention. This will require temporary disconnection of the power source 15 and then energizing the ground circuit a second time.

It is important to turn the Variac 18 back to zero before disconnecting the lead 15a and re-energizing to prevent an electrical shock. The gauss meter transverse probe 19 is used to scan the armature slots 21 until the slot with the highest measured reading has been identified, which should be in the order of 2–4 gauss. The probe 19 is then moved down the slot 21 away from the commutator end maintaining the same probe orientation.

A sudden reduction in the measured value indicates the location of the ground 17 on the winding 13, as this is the point where the current is flowing through the path to ground.

The area around the ground fault 17 location will eventually start to heat and after a few minutes will feel warm to the touch. This normally indicates the ground fault is in the top winding 13 in the slot 21. In addition, upon initial commencement of the ground test procedure a trace of smoke may be identified, but this may go undetected.

Similar data is obtained when the conductor shorted to the core is in the bottom layer of winding. Due to the short being in the bottom of the slot 21, the core surface area does not tend to get warm. The gauss meter axial probe 19 can be inserted beside the winding conductors in a parallel orientation on both the top and bottom windings allowing the test person to detect the conductor winding that is shorted. This enables the determination of whether the top or bottom winding is shorted.

Because the repair person can detect the exact location of the fault 17, careful removal of the damaged winding will enable root cause analysis of the ground fault. It is good practice to slit the top of the winding sheath and then remove the center conductor from the winding first relieving the pressure on the exterior windings. The exterior windings are then removed without causing damage to the sheath, which is in contact with the core.

Careful removal of the sheath will identify the exact cause of the fault i.e. scuffed during insertion, torn insulation from wedging or during the winding process, foreign particulate, etc.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. A method for locating ground faults in motor armatures comprising the steps of:
    a. shorting a commutator of a motor armature;
    b. connecting an AC power supply between the commutator and a core of the motor armature;
    c. increasing a magnitude of a voltage applied by the AC power supply to the commutator until current flows through a winding grounded point on the motor armature;
    d. moving a probe of a gauss meter along an edge of the core adjacent the commutator to locate a core slot having a highest magnetic field reading measured by the gauss meter; and
    e. moving the probe along the core slot with the highest reading until the gauss meter measures a sudden reduction in the magnetic field indicating the grounded point.

2. The method according to claim 1 wherein said step a. is performed by applying a shorting strap around the commutator.

3. The method according to claim 1 wherein said step b. is performed by connecting the AC power supply to the commutator through a load.

4. The method according to claim 1 wherein said step c. is performed by increasing the voltage magnitude from zero.

5. The method according to claim 1 including said steps d. and e. are performed by positioning the probe in the same direction as planes of laminations of the core and at a right angle to windings.

6. The method according to claim 1 including bumping the ground with a Hi-Pot tester at least once prior to performing said step b.

7. An apparatus for locating a ground fault in a motor armature comprising:
    a shorting strap;
    a variable voltage AC power supply; and
    a gauss meter having a probe whereby when said shorting strap is applied around a commutator of a motor armature, said AC power supply is connected between the commutator and a core of the motor armature to cause current to flow through a winding grounded point on the motor armature, and said probe is moved along an edge of the core adjacent the commutator to locate a slot having a highest magnetic field reading, said probe can be moved along the slot with the highest magnetic field reading until a sudden reduction in the magnetic field reading indicates the winding grounded point.

8. The apparatus according to claim 7 including a load connected between said AC power supply and the commutator.

9. A method for locating ground faults in motor armatures comprising the steps of:

a. shorting a commutator of a motor armature;

b. connecting a variable voltage AC power supply and a load in series between the commutator and a core of the motor armature;

c. increasing a magnitude of a voltage applied by the AC power supply to the commutator until current flows through a winding grounded point on the motor armature;

d. moving a probe of a gauss meter along an edge of the core adjacent the commutator to locate a core slot having a highest magnetic field reading measured by the gauss meter; and e. moving the probe along the core slot with the highest reading until the gauss meter measures a sudden reduction in the magnetic field indicating the grounded point.

10. The method according to claim 9 wherein said step a. is performed by applying a shorting strap around the commutator.

11. The method according to claim 9 wherein said step c. is performed by increasing the voltage magnitude from zero.

12. The method according to claim 9 including said steps d. and e. are performed by positioning the probe in the same direction as planes of laminations of the core and at a right angle to windings.

13. The method according to claim 9 including bumping the ground with a Hi-Pot tester at least once prior to performing said step b.

\* \* \* \* \*